US012772468B2

(12) United States Patent
Mei et al.

(10) Patent No.: US 12,772,468 B2
(45) Date of Patent: Oct. 20, 2026

(54) TRENCH POWER DEVICE INTEGRATED WITH INDUCTOR AND MANUFACTURING METHOD THEREFOR

(71) Applicant: CHONGQING ALPHA AND OMEGA SEMICONDUCTOR LIMITED, Chongqing (CN)

(72) Inventors: Bing Mei, Chongqing (CN); Yi Zhao, Chongqing (CN); Liang Shi, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 387 days.

(21) Appl. No.: 18/427,757

(22) Filed: Jan. 30, 2024

(65) Prior Publication Data

US 2024/0222420 A1 Jul. 4, 2024

Related U.S. Application Data

(63) Continuation of application No. PCT/CN2022/109825, filed on Aug. 3, 2022.

(30) Foreign Application Priority Data

Aug. 11, 2021 (CN) ........................ 202110918977.1

(51) Int. Cl.

| | |
|---|---|
| ***H10D 1/20*** | (2025.01) |
| ***H10D 84/80*** | (2025.01) |
| ***H10D 89/60*** | (2025.01) |

(52) U.S. Cl.
CPC ............ *H10D 1/20* (2025.01); *H10D 84/811* (2025.01); *H10D 89/611* (2025.01)

(58) Field of Classification Search
None
See application file for complete search history.

(56) References Cited

U.S. PATENT DOCUMENTS

2003/0119229 A1 6/2003 Roh et al.
2008/0258224 A1* 10/2008 Hshieh ................ H10D 84/221 438/237

(Continued)

FOREIGN PATENT DOCUMENTS

CN 103165571 A 6/2013
CN 112382566 A 2/2021

(Continued)

OTHER PUBLICATIONS

International Search Report issued in corresponding International application No. PCT/CN2022/109825, mailed Oct. 12, 2022.

(Continued)

*Primary Examiner* — William Henry Anderson

(57) ABSTRACT

The present disclosure relates to a technical filed of power devices and manufacturing of semiconductors, and in particular to a manufacturing method for trench power device integrated with inductor and a trench power device integrated with inductor manufactured thereby, and the manufacturing method includes: forming a cell structure and an integrated inductor, defining contact holes; C, forming a circuit link layer, and forming a passivation layer.

9 Claims, 8 Drawing Sheets

(56) References Cited

U.S. PATENT DOCUMENTS

| | | | | |
|---|---|---|---|---|
| 2011/0018054 A1* | 1/2011 | Pan | H10D 30/0297 | 438/694 |
| 2012/0193701 A1* | 8/2012 | Lin | H10D 30/0295 | 438/237 |
| 2013/0075809 A1* | 3/2013 | Hsieh | H10D 12/038 | 438/237 |
| 2014/0167218 A1* | 6/2014 | Mallikarjunaswamy | H10D 89/60 | 257/539 |
| 2015/0206967 A1* | 7/2015 | Hayashi | H10D 12/441 | 257/77 |
| 2018/0025970 A1* | 1/2018 | Kao | H10W 20/056 | 257/401 |
| 2018/0301553 A1* | 10/2018 | Weyers | H10D 30/668 | |
| 2019/0252536 A1* | 8/2019 | George | H10D 30/473 | |

FOREIGN PATENT DOCUMENTS

| | | |
|---|---|---|
| CN | 112382613 A | 2/2021 |
| CN | 113035840 A | 6/2021 |
| CN | 113644027 A | 11/2021 |

OTHER PUBLICATIONS

Written Opinion of the International Search Authority in corresponding International application No. PCT/CN2022/109825, mailed Oct. 12, 2022.

* cited by examiner

TRENCH POWER DEVICE INTEGRATED WITH INDUCTOR AND MANUFACTURING METHOD THEREFOR

TECHNICAL FIELD

The present disclosure relates to a technical filed of power devices and manufacturing of semiconductors, and in particular to a trench power device integrated with inductor and a manufacturing method therefor.

BACKGROUND

In order to reduce sizes and improve performance of power devices, trench structures are introduced to form trench power devices. Trench power devices are important components of electronic circuits, with significant advantages such as, high breakdown voltage and low leakage current in cut-off state; low on-state resistance and on-state voltage drop in on-state; high switching speed, low on-state loss, off-state loss, and switching loss in switching state, it makes trench power devices major power devices in the field of integrated circuits.

Trench power devices are widely used in the field of power management due to advantages such as low on-state resistance and high integration. In specific application to circuit design, gates are usually paired with inductance components for wave filtering and avoiding switching-on of devices induced by self-oscillation interference etc. Normally, inductors are welded onto a printed circuit board and connected to power devices through wires on the printed circuit board. Therefore, large space is usually spared for external inductors in printed circuit boards, which increases costs and is not conducive to miniaturization and integration of electronic devices.

SUMMARY

The present disclosure aims to provided a trench power device integrated with inductor and a manufacturing method therefor to solve the problem discussed in the background.

To achieve the above objects, the present disclosure provides the following technical schemes:

a manufacturing method for trench power device integrated with inductor, including:

a step A: forming a cell structure and an integrated inductor;

a step B: defining contact holes;

a step C: forming a circuit link layer; and a step D: forming a passivation layer.

As a further solution of the present disclosure, the step A specifically includes:

a step S1: growing an epitaxial layer on a silicon substrate by chemical vapor deposition;

a step S2: depositing a silicon dioxide thin film on the epitaxial layer as a hard mask for trench etching;

a step S3: spin coating a photoresist on the hard mask, and defining trench patterns using a mask on the photoresist and the hard mask through exposure by a lithography machine to form three types of trenches;

a step S4: forming a circuit pattern on the hard mask and transferring the circuit pattern onto the silicon substrate by dry etching, and removing the photoresist and the hard mask by wet etching;

a step S5: growing a sacrificial oxide layer on side walls of the trenches in a thermal oxidation process using a high-temperature furnace tube;

a step S6: removing the sacrificial oxide layer by wet etching, and growing a gate oxide layer in a thermal oxidation process using a high-temperature furnace tube;

a step S7: depositing a polycrystalline silicon layer on surfaces of the trenches and the silicon substrate by low-pressure chemical vapor deposition;

a step S8: removing polycrystalline silicon outside the trenches by chemical mechanical polish or dry etching;

a step S9: growing a silicon dioxide/nitride silicon/silicon dioxide composite thin film on the surface of the silicon substrate in a thermal oxidation process using a high-temperature furnace tube;

a step S10: depositing an intrinsic polycrystalline silicon layer on a surface of the silicon dioxide/nitride silicon/silicon dioxide composite thin film by low-pressure chemical vapor deposition;

a step S11: defining an electrostatic discharge protection diode (ESD) region in a photolithography process;

a step S12: transferring the circuit pattern in the ESD region onto the silicon substrate by dry etching, and removing unnecessary portions of the silicon dioxide/nitride silicon/silicon dioxide composite thin film and the photoresist;

a step S13: forming a transistor body region by ion implantation, and activating doped elements in the transistor body region by high-temperature thermal annealing;

a step S14: defining a transistor cell source region, an ESD diode region, and an interconnection gate region simultaneously in a photolithography process, and doping the transistor cell source region, the ESD diode region, and the interconnection gate region with doped elements by ion implantation, removing the photoresist and activating the doped elements by high-temperature thermal annealing, and ultimately obtaining the cell structure and the integrated inductor.

As a further solution of the present disclosure, in the steps S1, S10, and S13, trivalent elements are selected as doped elements to prepare a P-type device, and the trivalent elements includes boron; or pentavalent elements are selected as doped elements to prepare a N-type device, and the pentavalent elements includes arsenic or phosphorus.

As a further solution of the present disclosure, in the step S3, the three types of trenches includes a cell gate trench, an interconnection gate trench, and a wire coil trench.

As a further solution of the present disclosure, in the step S5, a thickness of the sacrificial oxide layer is 10100 nm; in the step S6, a thickness of the gate oxide layer is 10100 nm; in the step S7, a thickness of the polycrystalline silicon is 5001000 nm; and in the step S9, a thickness of the silicon dioxide nitride is 1002000 nm.

As a further solution of the present disclosure, in the step S7, pentavalent elements are doped during the low-pressure chemical vapor deposition or trivalent elements are doped by ion implantation after the gate being formed; and in the step S14, polarities of the doped elements are opposite to polarities of doped elements in the step S10.

As a further solution of the present disclosure, the step B specifically includes:

a step S15: forming an interlayer dielectric layer of silicon dioxide by chemical vapor deposition;

a step S16: simultaneously defining contact holes for a source region trench, contact holes at both ends of the ESD diode, a contact hole for the interconnection gate, and a contact hole at an end of the integrated inductor by photolithography; and a step S17: etching the interlayer dielectric layer of silicon dioxide by dry etching, and transferring patterns of all of the contact holes defined in step S16 to the silicon substrate.

As a further solution of the present disclosure, the step C specifically includes:

a step S18: doping high-concentration impurities to bottoms of the contact holes by ion implantation, and activating the high-concentration impurities to form an ohmic contact layer for all of the contact holes by rapid thermal annealing;

polarities of doped elements are the same as polarities of the doped element injected into the transistor body region in step S13;

a step S19: depositing titanium and titanium nitride as a bonding layer in a physical chemical vapor deposition process, and forming silicides by rapid thermal annealing, followed by depositing tungsten on the silicon substrate, and removing tungsten outside the contact holes by dry etching, ultimately forming tungsten plugs in the contact holes; and a step S20: depositing a metal layer of aluminum and copper by magnetron sputtering, and forming the circuit link layer by photolithography and dry etching, to couple the ESD and the integrated inductor to the trench power device.

As a further solution of the present disclosure, the step D specifically includes: depositing the passivation layer and defining an opening in a solder pad region by photolithography and dry etching processes for being encapsulated by wire bonding onto the solder pad lately; and the passivation layer includes silicon nitride or silicon dioxide.

A trench power device integrated with inductor manufactured by the manufacturing method described above is also provided.

The advantages of the present disclosure comparing with prior arts are that: an inductance component can be formed while forming the trench power device without an increase in number of mask and chip area, leading to controllable costs. Numbers of external inductors can be decreased according to the trench power device integrated with inductor, which results in a decrease in area of printed circuit boards occupied by the external inductors, thus reducing costs and miniaturizing equipment.

Figure 1:
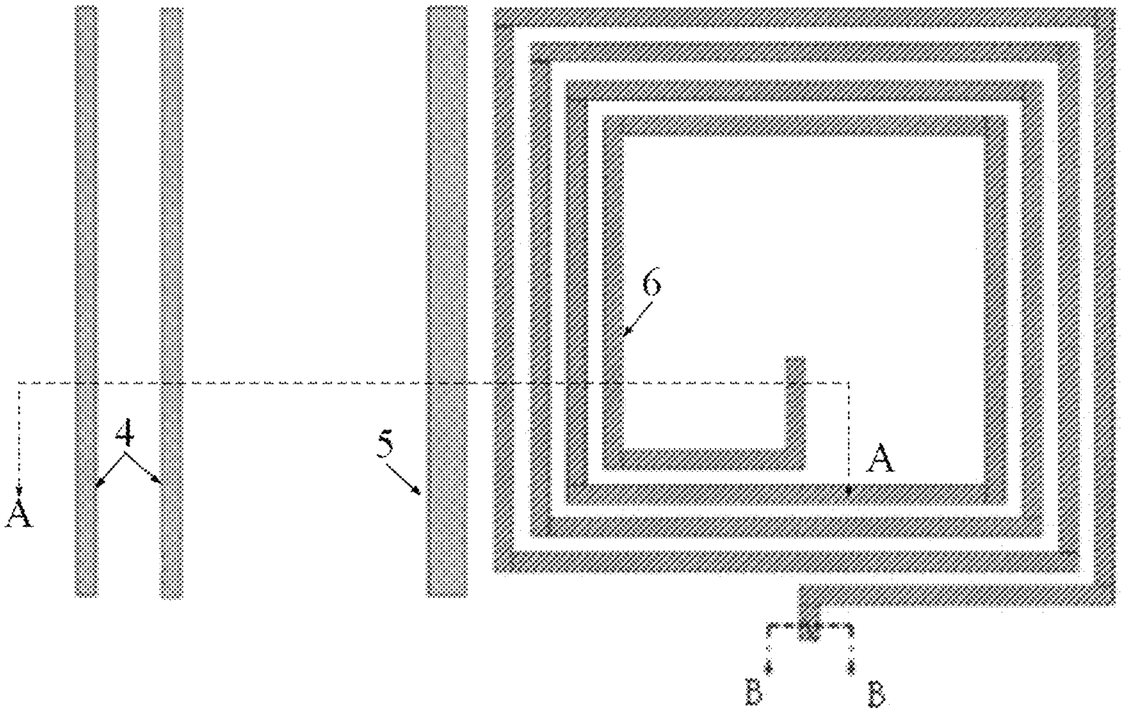
FIG. 1 is a top view of a structure of a trench power device integrated with inductor.

Reference Numeral: silicon substrate 1; epitaxial layer 2; hard mask 3; cell gate trench 4; gate trench 5; wire coil trench 6; sacrificial oxide layer 7; gate oxide layer 8; polycrystalline silicon layer 9; silicon dioxide/nitride silicon/silicon dioxide composite thin film 10; intrinsic polycrystalline silicon layer 11; ESD region 12; transistor body region 13; ESD diode region 14; transistor cell source region 15; interconnection gate region 16; interlayer dielectric layer of silicon dioxide 17; contact hole for source region trench 18; contact holes at both ends of the ESD diode 19; contact hole for the interconnection gate 20; contact hole at an end of the integrated inductor 21; ohmic contact layer 22; bonding layer 23; tungsten 24; circuit link layer 25

DETAILED DESCRIPTION OF PREFERRED EMBODIMENTS

The following will provide a clear and complete description of the technical solutions in the embodiments of the present disclosure, in conjunction with the accompanying drawings. Obviously, the described embodiments are only part of the embodiments according to the present disclosure, not all of them. A person having ordinary skill in the art may obtain other embodiments based on the embodiments provided in the present disclosure without any creative effort, which all belong to the scope of the present disclosure.

Figure 2:
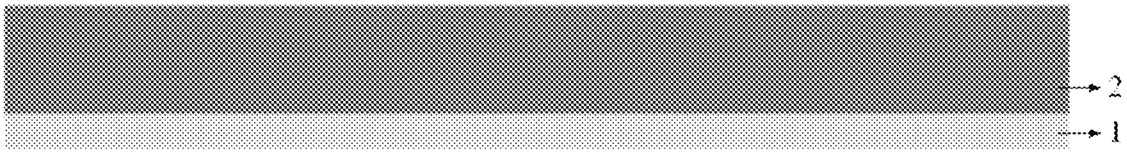
FIGS. 2 to 16 are schematic diagrams of step A in the manufacturing method of trench power device integrated with inductor.
Figure 3:
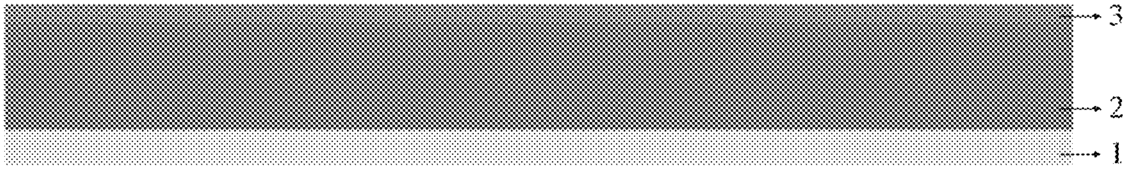
Figure 4:
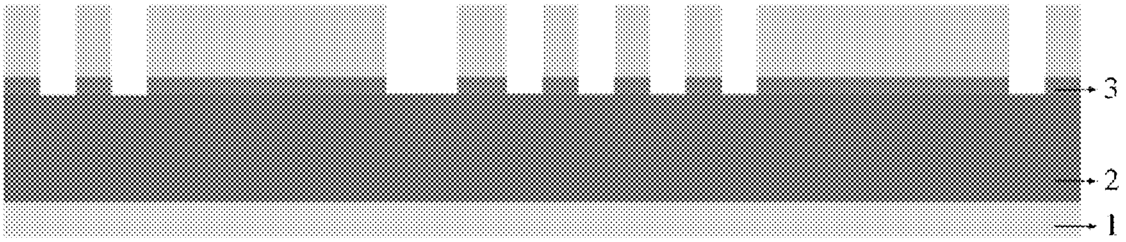
Figure 5:
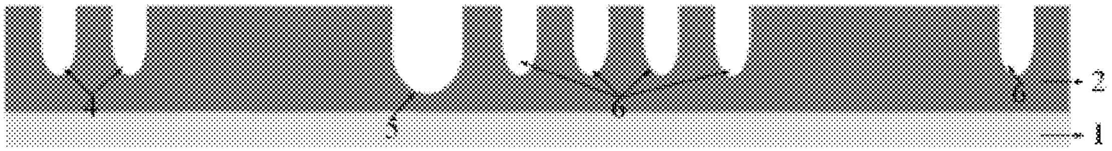
Figure 6:
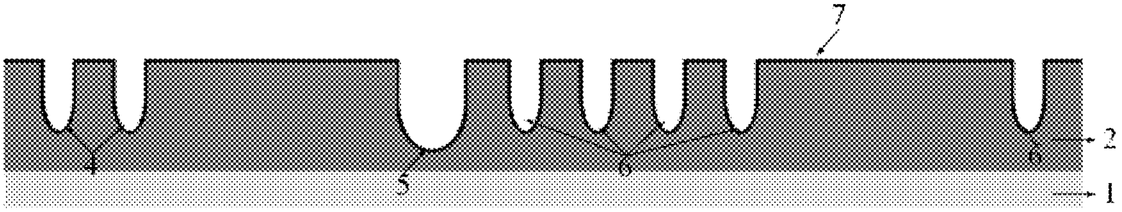
Figure 7:
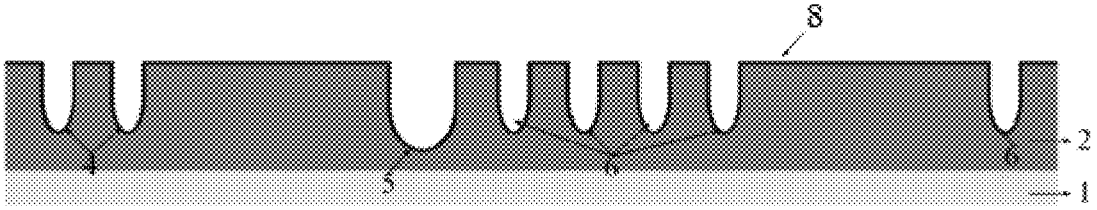
Figure 8:
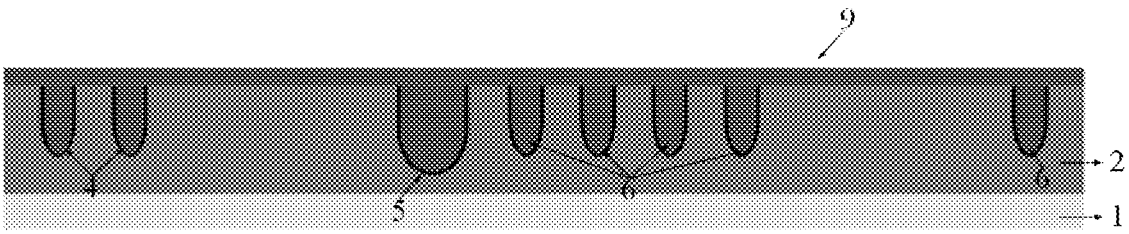
Figure 9:
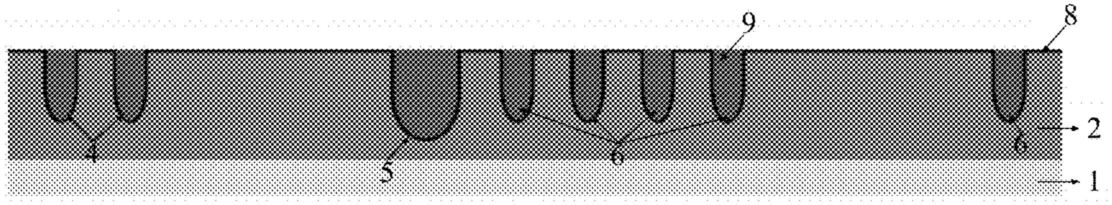
Figure 10:
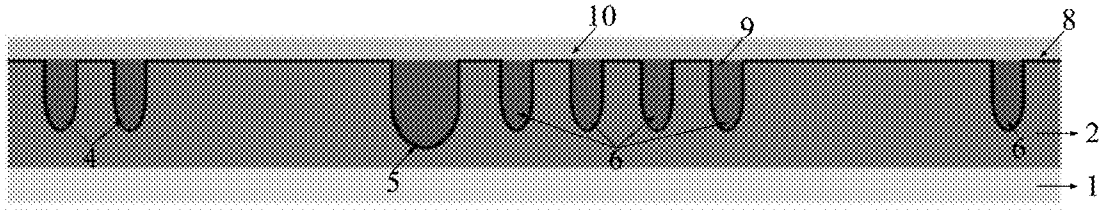
Figure 11:
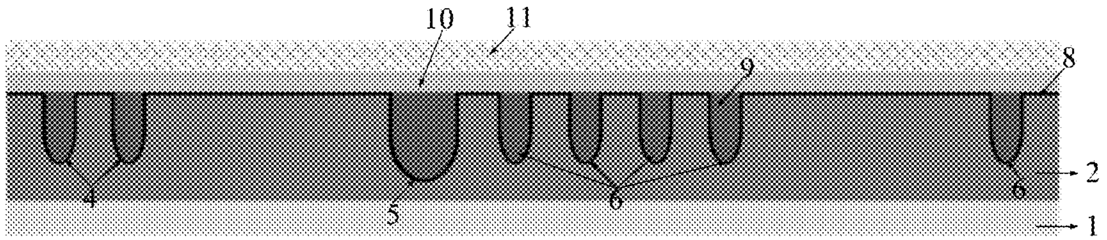
Figure 12:
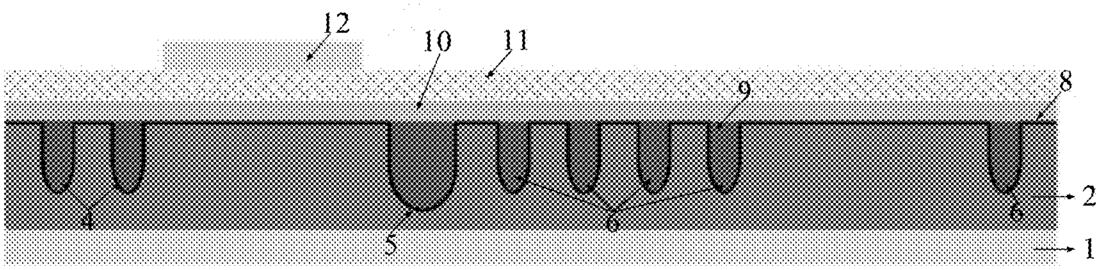
Figure 13:
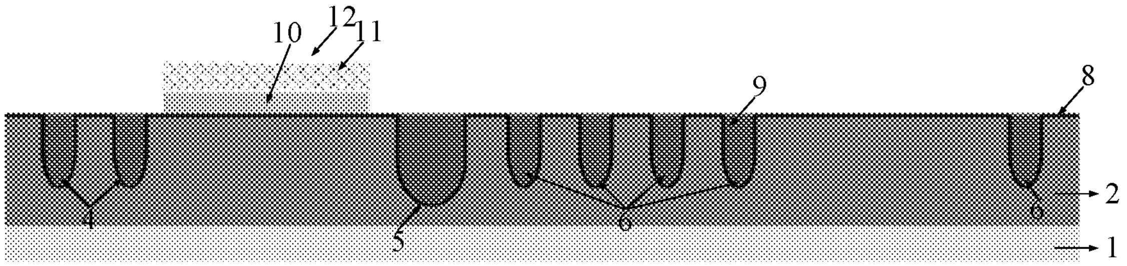
Figure 14:
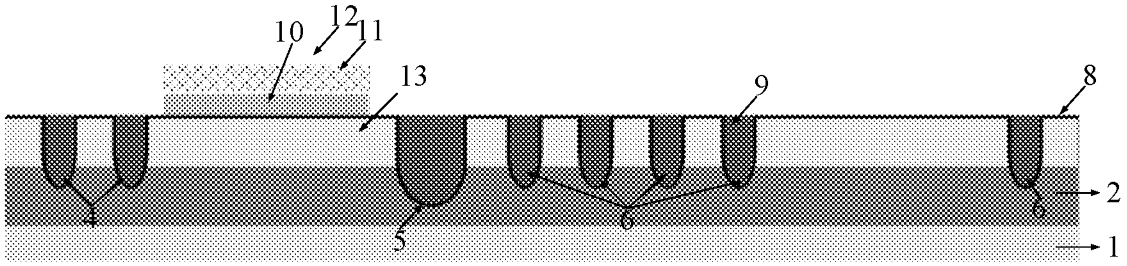
Figure 15:
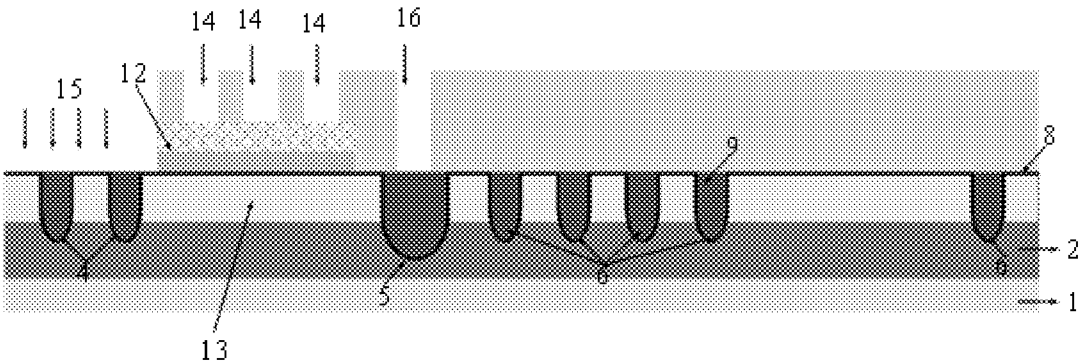

The present disclosure provides a manufacturing method for trench power device integrated with inductor, including:

a step A: forming a cell structure and an integrated inductor, which specifically including:

a step S1: growing an epitaxial layer 2 on a silicon substrate 1 by chemical vapor deposition, as shown in FIG. 2. Trivalent elements (such as, boron) may be selected as doped elements to prepare a P-type device; or pentavalent elements (such as, arsenic or phosphorus) may be selected as doped elements to prepare a N-type device according to polarities of power devices. Thickness of the epitaxial layer 2 varies on a micrometer scale depending on operating voltage.

a step S2: depositing a silicon dioxide thin film on the epitaxial layer 2 as a hard mask 3 for trench etching, as shown in FIG. 3. The hard mask 3 may be formed by low-pressure chemical vapor deposition or in a thermal oxidation process using a high-temperature furnace tube.

a step S3: spin coating a photoresist on the hard mask 3, and defining a trench pattern using a mask on the photoresist and the hard mask through exposure by a lithography machine, as shown in FIG. 4. Specially, three types of trenches are formed in this step: cell gate trenches 4 having smallest critical dimensions and configured for forming gates of cell transistors, an interconnection gate trench 5 having relatively great critical dimensions and configured for interconnection of gates of the cell transistors, and wire coil trenches 6 for the integrated inductor of which critical dimensions are determined according to a pre-set inductance value, critical dimensions of the wire coil trenches 6 may be consistent with that of the cell gate trenches 4 at a minimum, and is configured to form a wire coil of the integrated inductor.

a step S4: forming a circuit pattern on the hard mask 3 and transferring the circuit pattern onto the silicon substrate 1 by dry etching, and removing the photoresist and the hard mask 3 by wet etching, as shown in FIG. 5. Due to the characteristics of dry etching, the interconnection gate trenches 5 and wire coil trenches 6 are etched deeper, while cell gate trenches 4 with greater critical dimensions are etched deeper while the cell gate trenches 4 are etched shallower.

a step S5: growing a sacrificial oxide layer 7 on side walls of the trenches in a thermal oxidation process using a high-temperature furnace tube, as shown in FIG. 6. A thickness of the sacrificial oxide layer 7 ranges from 10 nanometers to 100 nanometers, approximately, and the sacrificial oxide layer 7 is configured to repair damages to silicon lattices on the sidewalls and rounds the sidewalls.

a step S6: removing the sacrificial oxide layer 7 by wet etching, and growing a gate oxide layer 8 in a thermal oxidation process using a high-temperature furnace tube, as shown in FIG. 7. A thickness of the gate oxide layer 8 may range from 10 nanometers to 100 nanometers according to use thereof.

a step S7: depositing a polycrystalline silicon layer 9 on surfaces of the trenches and the silicon substrate 1 by low-pressure chemical vapor deposition, as shown in FIG. 8. A thickness of the polycrystalline silicon layer 9 ranges from 500 nanometers to 100 nanometers. Pentavalent elements are doped during the low-pressure chemical vapor deposition or trivalent elements are doped by ion implantation after gate being formed according to the polarities of power devices.

a step S8: removing the polycrystalline silicon 9 outside the trenches by chemical mechanical polish or dry etching, as shown in FIG. 9.

a step S9: growing a silicon dioxide/nitride silicon/silicon dioxide composite thin film 10 on the surface of the silicon substrate 1 as an insulation layer for an electrostatic discharge protection diode (ESD) in a thermal oxidation process using a high-temperature furnace tube, as shown in FIG. 10. The thicknesses of the silicon dioxide and the silicon nitride may be adjusted in range of 100 nanometers to 2000 nanometers.

a step S10: depositing an intrinsic polycrystalline silicon layer 11 on a surface of the silicon dioxide/nitride silicon/silicon dioxide composite thin film 10 by low-pressure chemical vapor deposition, as shown in FIG. 11. Impurities implanted by ion implantation may be pentavalent elements (such as, arsenic, phosphorus) or trivalent elements (such as, boron), according to the polarities of power devices.

a step S11: defining an ESD region 12 in a photolithography process, as shown in FIG. 12.

a step S12: transferring a circuit pattern in the ESD region 12 onto the silicon substrate 1 by dry etching, and removing unnecessary portions of the silicon dioxide/nitride silicon/silicon dioxide composite thin film 10 and the photoresist, as shown in FIG. 13.

a step S13: forming a transistor body region 13 by ion implantation, and activating doped elements in the transistor body region 13 by high-temperature thermal annealing, as shown in FIG. 14. Impurities implanted by ion implantation may be trivalent elements (boron) or pentavalent elements (arsenic, phosphorus), according to the polarities of power devices.

a step S14: defining transistor cell source regions 15, an ESD diode region 14, and an interconnection gate region 16 simultaneously in a photolithography process, and doping the transistor cell source regions 15, the ESD diode region 14, and the interconnection gate region 16 with doped elements by ion implantation, and removing the photoresist and activating the doped elements by high-temperature thermal annealing, as shown in FIG. 15. Specially, polarities of the doped elements are opposite to polarities of doped elements in the step S10 to form a PN junction diode in the ESD region 12.

Figure 16:
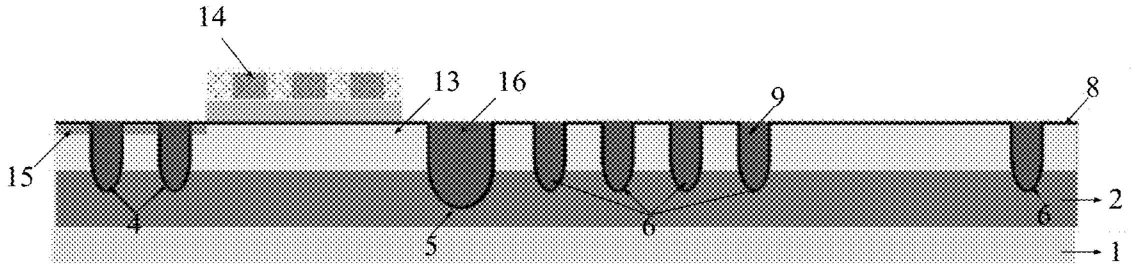
Figure 17:
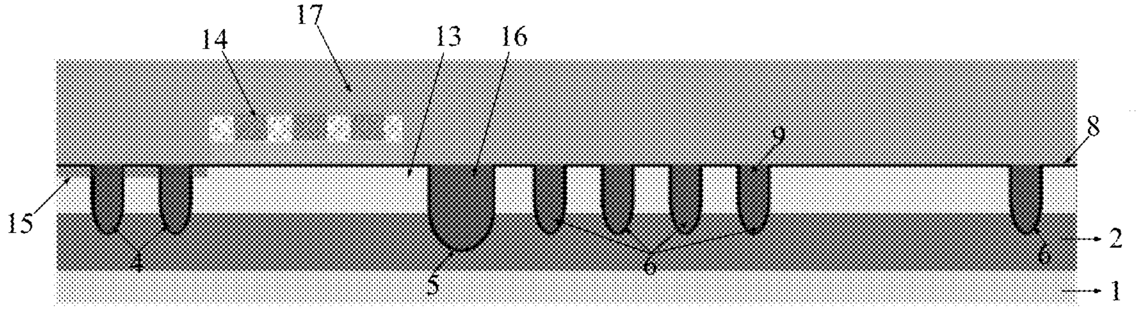
FIGS. 17 to 19 are schematic diagrams of step B in the manufacturing method of trench power device integrated with inductor.

As shown in FIG. 16, the cell structure and the integrated inductor have been formed, and subsequent processes are mainly for the formation of device isolation and metallic interconnection.

Figure 18:
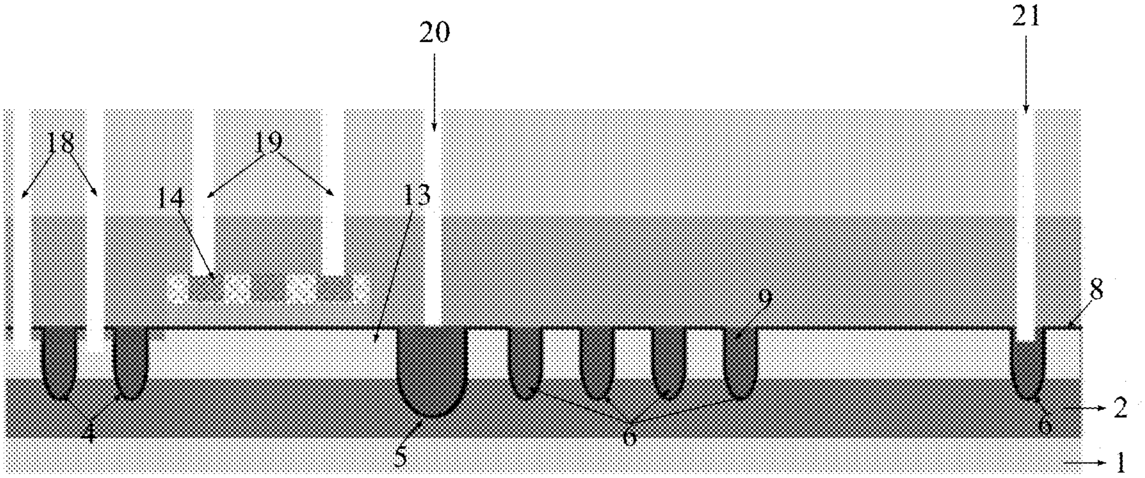
Figure 19:
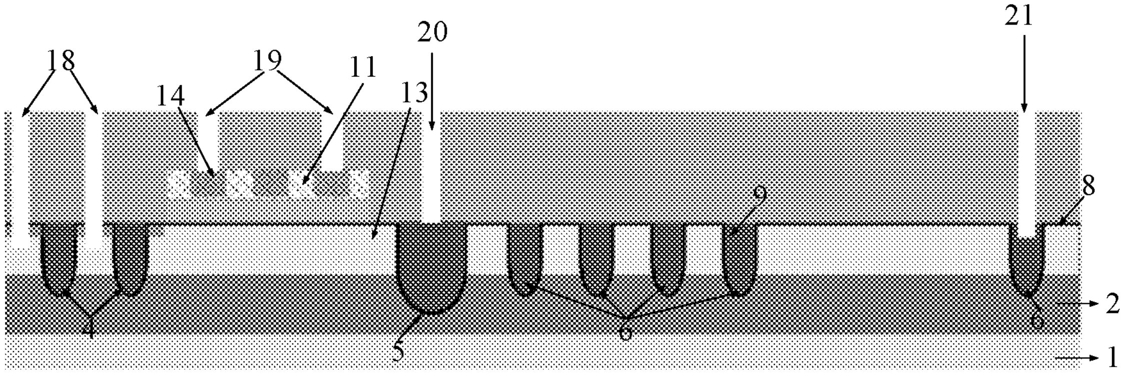

The step B of defining contact holes specifically includes:

a step S15, forming an interlayer dielectric layer of silicon dioxide 17 by chemical vapor deposition, as shown in FIG. 15. The interlayer dielectric layer of silicon dioxide 17 may be doped with impurities such as, boron or phosphorus to improve thin film fluidity and adsorption of external impurities.

a step S16, simultaneously defining contact holes for source region trenches 18, contact holes at both ends of the ESD diode 19, a contact hole for the interconnection gate 20, and a contact hole at an end of the integrated inductor 21 by photolithography, as shown in FIG. 18.

a step S17, etching the interlayer dielectric layer of silicon dioxide 17 by dry etching, and transferring patterns of all of the contact holes to the silicon substrate 1, as shown in FIG. 19.

Figure 20:
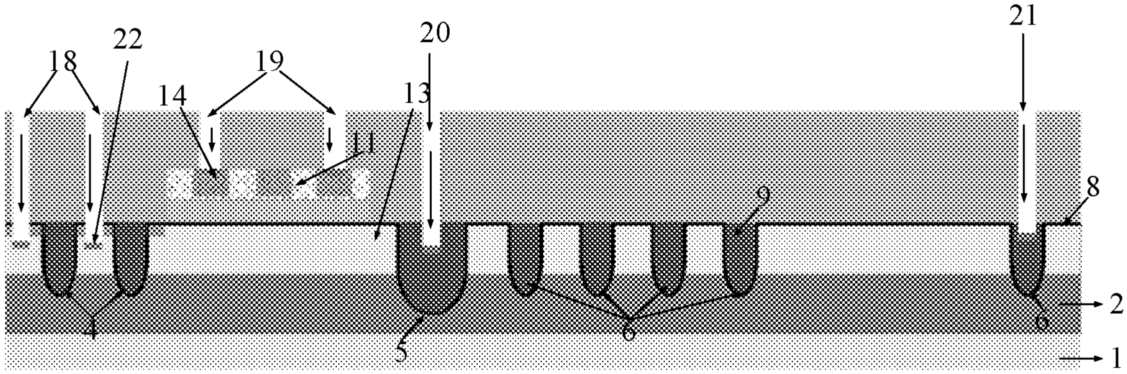
FIGS. 20 to 22 are schematic diagrams of step C in the manufacturing method of trench power device integrated with inductor.
Figure 21:
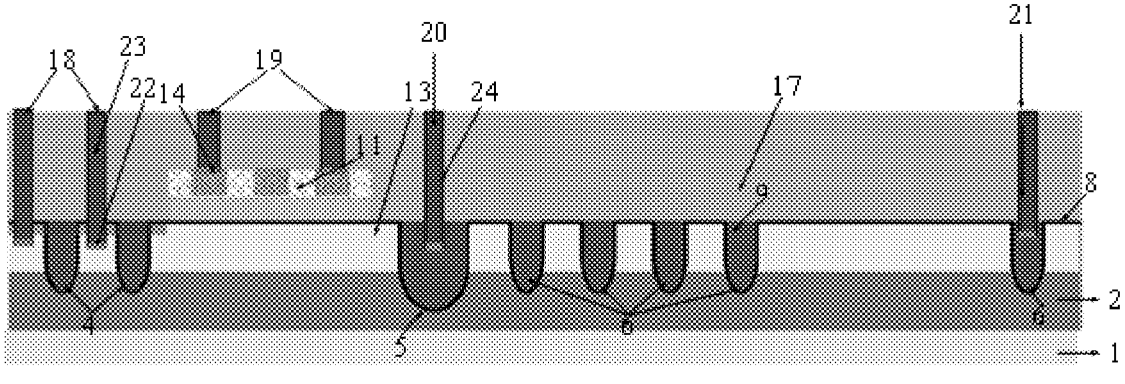
Figure 22:
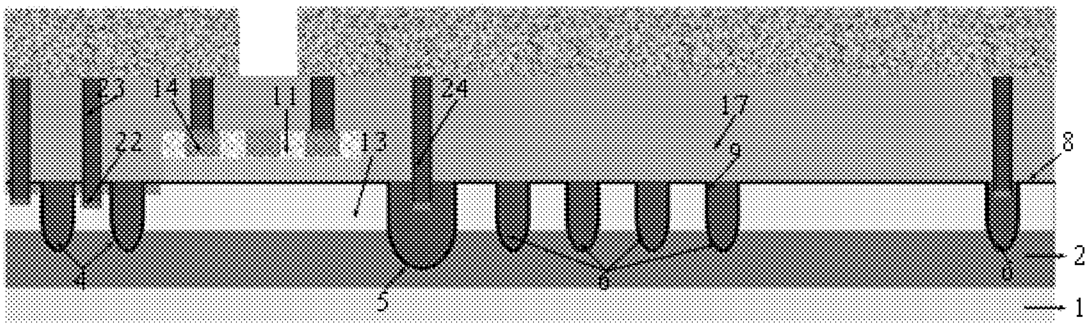

The step C of forming a circuit link layer specifically includes:

a step S18, doping high-concentration impurities to bottoms of the contact holes by ion implantation, and activating the high-concentration impurities to form an ohmic contact layer 22 for all of the contact holes by rapid thermal annealing, as shown in FIG. 20. Specially, polarities of doped elements in step S18 are the same as polarities of doped element injected into the transistor body region 13 in step S13.

a step S19, depositing titanium and titanium nitride as a bonding layer 23 in a physical chemical vapor deposition process, and forming silicides by rapid thermal annealing, as shown in FIG. 21; and depositing tungsten 24 on the silicon substrate 1, and removing the tungsten 24 outside the contact holes by dry etching, and ultimately forming tungsten plugs in the contact holes.

a step S20, depositing a metal layer of aluminum and copper 25 by magnetron sputtering, and forming the circuit link layer 25 by photolithography and dry etching to couple the ESD and the integrated inductor to the trench power device, as shown in FIG. 22.

Figure 23:
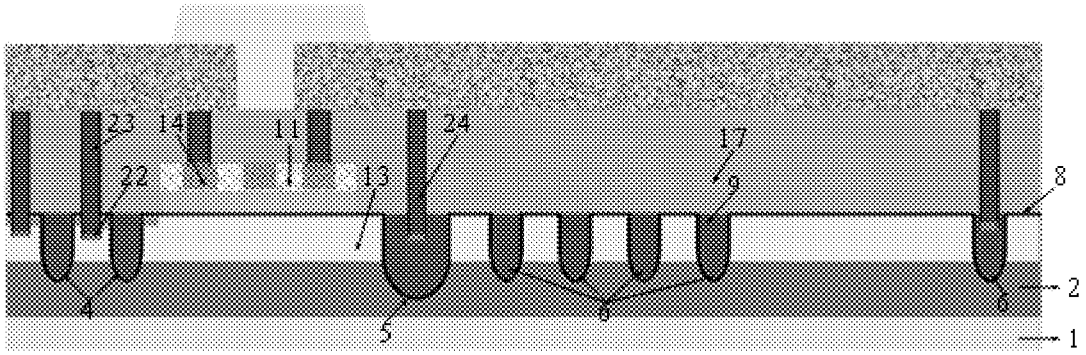
FIG. 23 is schematic diagram of step D in the manufacturing method of trench power device integrated with inductor.

The step D of forming a passivation layer specifically includes: depositing the passivation layer (silicon nitride or silicon dioxide) and defining an opening in a solder pad region by photolithography and dry etching for being encapsulated by wire bonding onto solder pads lately, as shown in FIG. 23. At this point, the entire process flow is completed.

Figure 24:
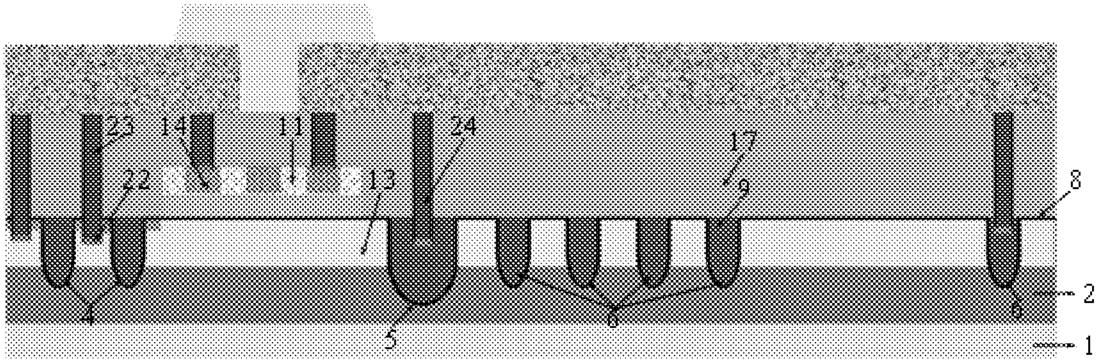
FIG. 24 is a cross-sectional view along a AA line in FIG. 1.
Figure 25:
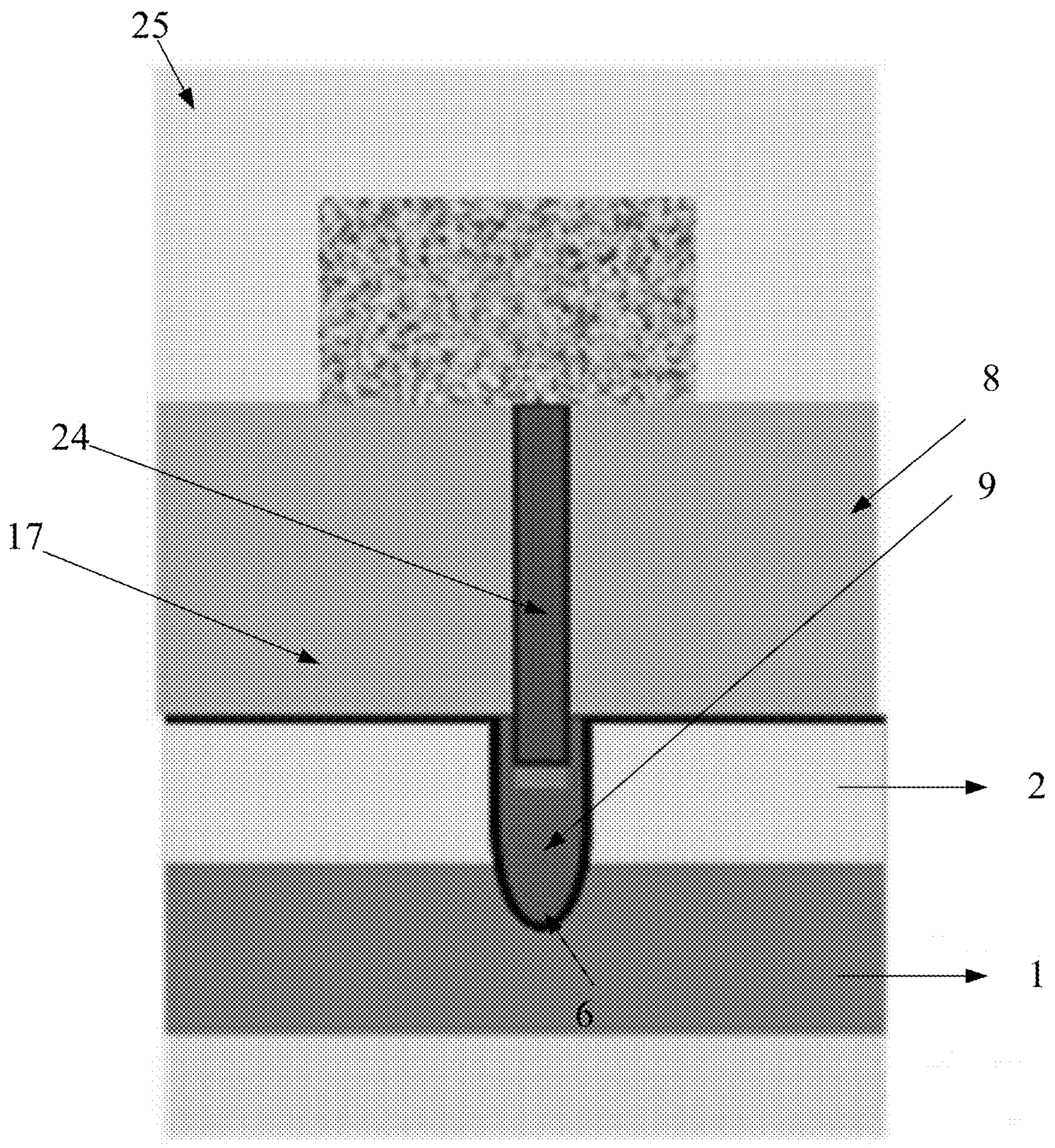
FIG. 25 is a cross-sectional view along a BB line in FIG. 1.

Referring to FIGS. 1, 24, and 25, a trench power device with integrated inductor is ultimately obtained. According to the present disclosure, an inductance component can be formed while forming the trench power device without an increase in number of mask and chip area, leading to controllable costs. Numbers of external inductors can be decreased according to the trench power device integrated with inductor, which results in a decrease in area of printed circuit boards occupied by the external inductors, thus reducing costs and miniaturizing equipment.

For those skilled in the art, it is obviously that the present invention is not limited to the details of the exemplary embodiments mentioned above, and can be implemented in other specific forms without departing from the spirit or basic features of the present invention. Therefore, from any perspective, embodiments should be regarded as exemplary and non-restrictive. The scope of the present invention is limited by the accompanying claims rather than the above description. Therefore, it is intended to include all variations falling within the meaning and scope of the equivalent elements of the claims within the scope of the present invention. Any reference numerals in the claims should not be regarded as restrictions to the claims involved.

In addition, it should be understood that although this specification is described in embodiments, but each embodiment does not only include one independent technical solution. This description of the specification is only for clarity, and those skilled in the art should consider the specification as a whole. The technical solutions in each embodiment can also be appropriately combined to form other embodiments that those skilled in the art can understand.

What is claimed is:

1. A manufacturing method for trench power device integrated with inductor, comprising:

a step A: forming a cell structure and an integrated inductor;
a step B: defining contact holes;
a step C: forming a circuit link layer; and
a step D: forming a passivation layer;
wherein the step A specifically comprises:
a step S1: growing an epitaxial layer on a silicon substrate;
a step S2: depositing a silicon dioxide thin film on the epitaxial layer as a hard mask for trench etching;
a step S3: coating a photoresist on the hard mask, and defining trench patterns using a mask on the hard mask and the photoresist to form three types of trenches;
a step S4: forming a circuit pattern on the hard mask and transferring the circuit pattern onto the silicon substrate, and removing the photoresist and the hard mask;
a step S5: growing a sacrificial oxide layer on side walls of the trenches;
a step S6: removing the sacrificial oxide layer, and growing a gate oxide layer;
a step S7: depositing a polycrystalline silicon layer on surfaces of the trenches and the silicon substrate;
a step S8: removing polycrystalline silicon outside the trenches;
a step S9: growing a silicon dioxide/nitride silicon/silicon dioxide composite thin film on the surface of the silicon substrate;
a step S10: depositing an intrinsic polycrystalline silicon layer on a surface of the silicon dioxide/nitride silicon/silicon dioxide composite thin film;
a step S11: defining an electrostatic discharge protection diode (ESD) region in a photolithography process;
a step S12: transferring a circuit pattern in the ESD region onto the silicon substrate, and removing unnecessary portions of the silicon dioxide/nitride silicon/silicon dioxide composite thin film and a second photoresist;
a step S13: forming a transistor body region, and activating doped elements in the transistor body region;
a step S14: defining a transistor cell source region, an ESD diode region, and an interconnection gate region simultaneously, and doping the transistor cell source region, the ESD diode region, and the interconnection gate region with doped elements, removing a third photoresist and activating the doped elements, and ultimately obtaining the cell structure and the integrated inductor.

2. The manufacturing method for trench power device integrated with inductor according to claim 1, wherein in the steps S1, S10, and S13, trivalent elements are selected as doped elements to prepare a P-type device, and the trivalent elements comprises boron; or pentavalent elements are selected as doped elements to prepare a N-type device, and the pentavalent elements comprises arsenic or phosphorus.

3. The manufacturing method for trench power device integrated with inductor according to claim 1, wherein in the step S3, the three types of trenches comprise a cell gate trench, an interconnection gate trench, and a wire coil trench.

4. The manufacturing method for trench power device integrated with inductor according to claim 1, wherein in the step S5, a thickness of the sacrificial oxide layer is 10-100 nm; in the step S6, a thickness of the gate oxide layer is 10-100 nm; in the step S7, a thickness of the polycrystalline silicon is 500-1000 nm; and in the step S9, a thickness of the silicon dioxide nitride is 100-2000 nm.

5. The manufacturing method for trench power device integrated with inductor according to claim 1, wherein in the step S7, pentavalent elements are doped during a low-pressure chemical vapor deposition or trivalent elements are doped after a gate being formed; and in the step S14, polarities of the doped elements are opposite to polarities of doped elements in the step S10.

6. The manufacturing method for trench power device integrated with inductor according to claim 1, wherein the step B specifically comprises:

a step S15: forming an interlayer dielectric layer of silicon dioxide;
a step S16: simultaneously defining contact holes for a source region trench, contact holes at both ends of the ESD diode region, a contact hole for the interconnection gate, and a contact hole at an end of the integrated inductor; and
a step S17: etching the interlayer dielectric layer of silicon dioxide, and transferring patterns of all of the contact holes defined in step S16 to the silicon substrate.

7. The manufacturing method for trench power device integrated with inductor according to claim 1, wherein the step C specifically comprises:

a step S18: doping high-concentration impurities to bottoms of the contact holes, and activating the high-concentration impurities to form an ohmic contact layer for all of the contact holes; wherein polarities of the high-concentration impurities are the same as polarities of the doped element injected into the transistor body region in the step S13;
a step S19: depositing titanium and titanium nitride as a bonding layer, and forming silicides, followed by depositing tungsten on the silicon substrate, and removing tungsten outside the contact holes, ultimately forming tungsten plugs in the contact holes; and
a step S20: depositing a metal layer of aluminum and copper, and forming the circuit link layer, to couple the ESD diode region and the integrated inductor to the trench power device.

8. The manufacturing method for trench power device integrated with inductor according to claim 1, wherein the step D specifically comprises: depositing the passivation layer and defining an opening in a solder pad region; and the passivation layer comprises silicon nitride or silicon dioxide.

9. A trench power device integrated with inductor manufactured by the manufacturing method for trench power device integrated with inductor according to claim 1.

* * * * *